United States Patent
Kojima

(10) Patent No.: US 7,710,780 B2
(45) Date of Patent: May 4, 2010

(54) SEMICONDUCTOR NON-VOLATILE MEMORY

(75) Inventor: Makoto Kojima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/268,891

(22) Filed: Nov. 11, 2008

(65) Prior Publication Data

US 2009/0129164 A1 May 21, 2009

(30) Foreign Application Priority Data

Nov. 15, 2007 (JP) .............................. 2007-297059

(51) Int. Cl.
*G11C 16/04* (2006.01)
(52) U.S. Cl. ...................... 365/185.18; 365/185.05; 365/185.16
(58) Field of Classification Search ............ 365/185.18, 365/185.05, 185.16
See application file for complete search history.

(56) References Cited

U.S. PATENT DOCUMENTS

| | | | | |
|---|---|---|---|---|
| 5,517,448 A * | 5/1996 | Liu | ........................ | 365/185.11 |
| 5,754,469 A * | 5/1998 | Hung et al. | ............. | 365/185.03 |
| 5,805,501 A * | 9/1998 | Shiau et al. | ............. | 365/185.29 |
| 6,058,044 A | 5/2000 | Sugiura et al. | | |
| 6,128,226 A | 10/2000 | Eitan et al. | | |
| 6,134,156 A | 10/2000 | Eitan | | |
| 6,717,839 B1 | 4/2004 | Du | | |
| 6,937,523 B2 | 8/2005 | Eshel | | |
| 7,023,728 B2 * | 4/2006 | Pascucci | ................. | 365/185.01 |
| 7,158,413 B2 * | 1/2007 | Kasai et al. | ............. | 365/185.18 |
| 2004/0190335 A1 * | 9/2004 | Pascucci | ................. | 365/185.01 |
| 2004/0240247 A1 | 12/2004 | Lee et al. | | |
| 2005/0243628 A1 * | 11/2005 | Kasai et al. | ................. | 365/222 |

* cited by examiner

*Primary Examiner*—Tuan T. Nguyen
(74) *Attorney, Agent, or Firm*—McDermott Will & Emery LLP

(57) ABSTRACT

A semiconductor non-volatile memory, wherein a memory cell can be read accurately without having to discharge bit lines before the read operation. When reading a memory cell, the first bit line connected to the drain thereof is connected to the voltage source to receive a predetermined voltage, and the second bit line connected to the source thereof is connected to the sense amplifier. In this process, the third bit line in the vicinity of the second bit line is connected to the ground power supply. Thus, since the third bit line in the vicinity of the second bit line being sensed is forcibly set to the ground level, no charge flows in therefrom, thus preventing a current flowing into the second bit line.

8 Claims, 7 Drawing Sheets

FIG. 2

|  | READ 00 | READ 01 | READ 02 | READ 03 | READ 04 | READ 05 | READ 06 | READ 07 |
|---|---|---|---|---|---|---|---|---|
| MBL[0] | Vs | FLOAT | FLOAT | Vs | Vs | FLOAT | FLOAT | FLOAT |
| MBL[1] | Vd | Vd | GND | GND | Vd | Vd | GND | FLOAT |
| MBL[2] | FLOAT | Vs | Vs | FLOAT | FLOAT | Vs | Vs | FLOAT |
| MBL[3] | FLOAT | GND | Vd | Vd | GND | GND | Vd | Vd |
| MBL[4] | FLOAT | FLOAT | FLOAT | FLOAT | FLOAT | FLOAT | FLOAT | Vs |
| MBL[5] | FLOAT | FLOAT | FLOAT | FLOAT | FLOAT | FLOAT | FLOAT | GND |
| MBL[6] | FLOAT | FLOAT | FLOAT | FLOAT | FLOAT | FLOAT | FLOAT | FLOAT |
| MBL[7] | FLOAT | FLOAT | FLOAT | FLOAT | FLOAT | FLOAT | FLOAT | FLOAT |
| SEL[00] | HIGH | LOW | LOW | LOW | LOW | LOW | LOW | HIGH |
| SEL[01] | LOW | LOW | LOW | HIGH | HIGH | LOW | LOW | LOW |
| SEL[02] | LOW | HIGH | HIGH | LOW | LOW | LOW | LOW | LOW |
| SEL[03] | LOW | LOW | LOW | LOW | LOW | HIGH | HIGH | LOW |
| SEL[04] | HIGH | HIGH | HIGH | LOW | LOW | LOW | LOW | HIGH |
| SEL[05] | LOW | LOW | LOW | HIGH | HIGH | HIGH | HIGH | LOW |
| SEL[06] | LOW | HIGH | HIGH | HIGH | HIGH | LOW | LOW | LOW |
| SEL[07] | LOW | LOW | LOW | LOW | LOW | HIGH | HIGH | HIGH |

FIG. 3

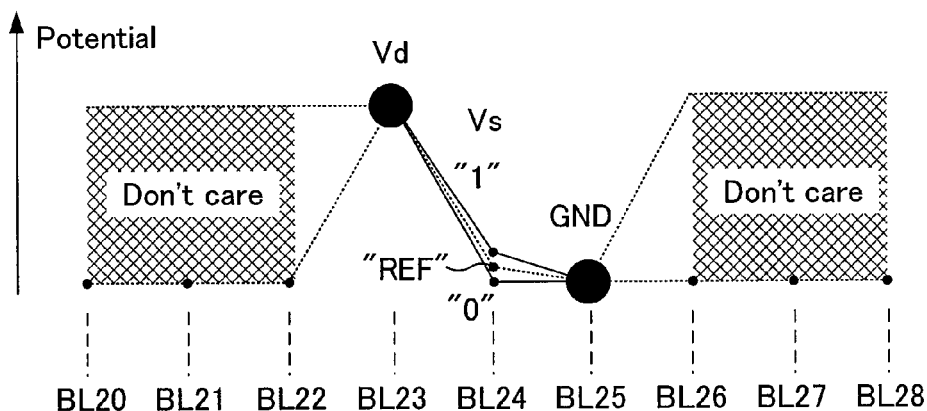

FIG. 5

|        | READ 00 | READ 01 | READ 02 | READ 03 | READ 04 | READ 05 | READ 06 | READ 07 |
|--------|---------|---------|---------|---------|---------|---------|---------|---------|
| MBL[0] | Vs      | GND     | GND     | Vs      | Vs      | GND     | GND     | FLOAT   |
| MBL[1] | Vd      | Vd      | Vns     | Vns     | Vd      | Vd      | Vns     | FLOAT   |
| MBL[2] | FLOAT   | Vs      | Vs      | GND     | GND     | Vs      | Vs      | FLOAT   |
| MBL[3] | FLOAT   | Vns     | Vd      | Vd      | Vns     | Vns     | Vd      | Vd      |
| MBL[4] | FLOAT   | FLOAT   | FLOAT   | FLOAT   | FLOAT   | FLOAT   | Vns     | Vs      |
| MBL[5] | FLOAT   | FLOAT   | FLOAT   | FLOAT   | FLOAT   | FLOAT   | FLOAT   | Vns     |
| MBL[6] | FLOAT   | FLOAT   | FLOAT   | FLOAT   | FLOAT   | FLOAT   | FLOAT   | GND     |
| MBL[7] | FLOAT   | FLOAT   | FLOAT   | FLOAT   | FLOAT   | FLOAT   | FLOAT   | FLOAT   |
| SEL[00]| HIGH    | LOW     | HIGH    | LOW     | LOW     | HIGH    | LOW     | HIGH    |
| SEL[01]| LOW     | HIGH    | LOW     | HIGH    | HIGH    | LOW     | HIGH    | LOW     |
| SEL[02]| LOW     | HIGH    | HIGH    | HIGH    | HIGH    | LOW     | LOW     | HIGH    |
| SEL[03]| LOW     | LOW     | LOW     | LOW     | LOW     | HIGH    | HIGH    | LOW     |
| SEL[04]| HIGH    | HIGH    | HIGH    | LOW     | LOW     | LOW     | LOW     | HIGH    |
| SEL[05]| LOW     | LOW     | LOW     | HIGH    | HIGH    | HIGH    | HIGH    | LOW     |
| SEL[06]| LOW     | HIGH    | HIGH    | HIGH    | HIGH    | LOW     | LOW     | LOW     |
| SEL[07]| LOW     | LOW     | LOW     | LOW     | LOW     | HIGH    | HIGH    | HIGH    |

FIG. 6

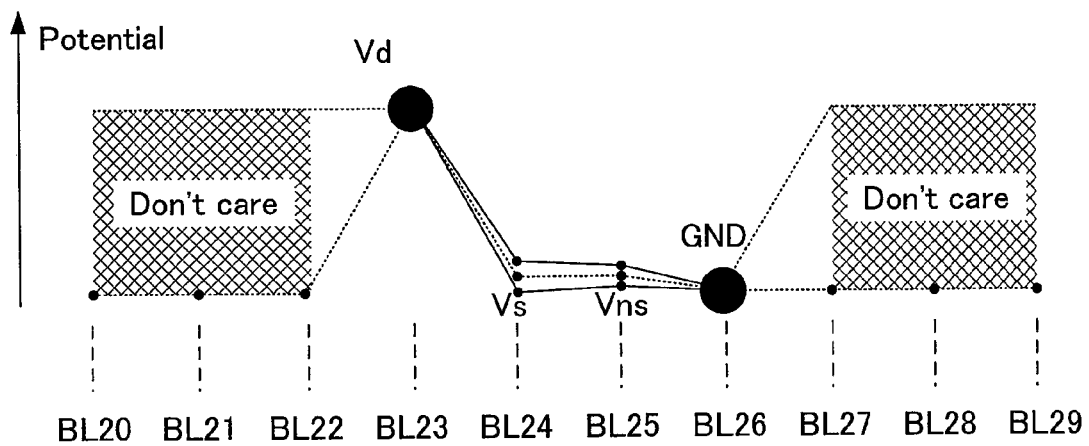

PRIOR ART

PRIOR ART

SEMICONDUCTOR NON-VOLATILE MEMORY

CROSS REFERENCE TO RELATED APPLICATION

This application claims priority under 35 U.S.C. §119 on Patent Application No. 2007-297059 filed in Japan on Nov. 15, 2007, the entire contents of which are hereby incorporated by reference.

BACKGROUND OF THE INVENTION

1. Field of the Invention

The present invention relates to a semiconductor non-volatile memory and, more particularly, to a circuit configuration for a memory cell read operation.

2. Description of the Background Art

There are increasing demands for smaller sizes and larger capacities of semiconductor non-volatile memories. For high-speed applications, VGA (Virtual Ground Architecture)-type semiconductor non-volatile memories, being one type of NOR-type memories, have often been used in view of the degree of integration. A VGA-type memory includes an uninterrupted arrangement of memory cells between all bit lines, wherein adjacent memory cells share a bit line therebetween, thereby allowing for miniaturization substantially in conformity with the $4F^2$ scaling law.

However, in a VGA-type memory, where every bit line is shared by adjacent memory cells, bit lines adjacent to a memory cell [characteristics are successively charged by the drain voltage application to the memory cell being read (and, albeit slightly, by the source voltage of the memory cell being read). Therefore, an excessive charge on each bit line during a previous read operation needs to be collected by a somewhat complicated process. Therefore, they are not so often used in applications where high-speed read operations are needed, and are limited to low-speed, large-capacity applications.

In recent memory systems, there are more demands for increasing the memory capacity than for the rate of miniaturization, and there is also an increasing demand for a higher read speed. Therefore, there is a strong demand for semiconductor non-volatile memories that can realize both an increase in the capacity and an increase in the speed.

Patent Documents 1, 2 and 3, identified below, propose the employment of the ground-sensing method with VGA-type semiconductor non-volatile memories.

Patent Document 1: U.S. Pat. No. 6,128,226 (FIG. 1 on page 1)

Patent Document 2: U.S. Pat. No. 6,134,156 (FIG. 6 on page 6)

Patent Document 3: U.S. Pat. No. 6,937,523 (FIG. 3 on page 2)

SUMMARY OF THE INVENTION

Although Patent Documents 1, 2 and 3, are not explicit about the configuration of the hierarchical bit line architecture, the hierarchical bit line architecture is indispensable for increasing the memory capacity. Thus, conventional memories of the patent documents above will be discussed below as they are combined with the hierarchical bit line architecture to identify problems in the art to be solved by the present invention.

FIG. 9A shows a configuration of a semiconductor non-volatile memory according to a first conventional example disclosed in Patent Documents 1 and 2 where a hierarchical bit line architecture is employed. Referring to the configuration of FIG. 9A, an operation of reading out a memory cell 03, among memory cells 00 to 0F and 10 to 1F, will be described. Bit lines 20 to 2G are all discharged. In view of the periodic arrangement of selection gates, regions 50 and 51 are shown in the figure as unit regions, for the sake of understanding.

A word line WL[00] is activated in order to read the memory cell 03. A selection gate signal SEL[06] is activated to connect a bit line BL23 (drain bit line) to a main bit line MBL[3] via a selection gate 42, and a Y selector 60b connects the main bit line MBL[3] to the voltage source Vd. A selection gate signal SEL[01] is activated to connect a bit line BL24 (source bit line) to a main bit line MBL[0] via a selection gate 31, and the Y selector 60b connects the main bit line MBL[0] to a sense amplifier 71 and a sense input reset transistor 70.

The sense input reset transistor 70 is left ON until the voltage applied to the memory cell 03 becomes stable, after which the sense input reset transistor 70 is opened. Where the memory cell 03 is in the "1" state (or "ON"), the voltage Vs of the source bit line BL24 is gradually increased by the current flow between the bit lines BL23 and BL24. Where the memory cell 03 is in the "0" state (or "OFF"), no current flows between the bit lines BL23 and BL24, and the voltage Vs of the source bit line BL24 remains at 0 V.

FIG. 9B shows potentials of bit lines after the passage of the sense integration period. Referring to FIG. 9B, the voltage Vd is applied to the drain bit line BL23, and the voltage Vs, the ideal value of which is typically about 0 V or about 0.3 V, depending on the value ("1" or "0") stored in the memory cell 03 appears on the source bit line BL24. The reference voltage Ref, with respect to which read data is interpreted, is set to a value in the middle between the typical values of the voltage Vs. The sense amplifier 71 compares the voltage at the sense node connected to the source bit line BL24 with the reference voltage Ref to thereby determine the value ("1" or "0") stored in the memory cell 03.

With continued reference to FIG. 9B, consider bit lines other than those (the drain bit line BL23 and the source bit line BL24) engaged in the read operation. Among all the memory cells connected to the active word line WL[00], if the memory cell 03 being read and the next memory cell 04 to the right remain at "1", a current starts to flow through the next bit line BL25 to the right and through the next bit line BL26 further to the right, and the bit line voltages thereof increase successively, as the voltage of the source bit line BL24 increases. In other words, depending on the state of a memory cell connected to the same word line as the memory cell being read, a charge leaks successively to bit lines next to the source bit line. Similarly, a charge leaks also to bit lines on the left side of the drain bit line BL23.

If a read operation is started with multiple bit lines being charged as described above, a charge will flow in from the source bit line side of the memory cell being read, depending on the state of other memory cells connected to the active word line. For example, when the memory cell being read is in the "0" state, a current from a bit line on the right side may increase the voltage of the source bit line, whereby "0" may be erroneously interpreted as "1". In other words, a normal read operation may be inhibited due to an excessive leak charge from the previous read operation. Therefore, it is necessary to collect such an excessive leak charge from a read operation before the next read cycle. For example, according to Patent Document 2, "all of the bit lines are discharged to the ground" before a read operation is performed.

In order to discharge all of the bit lines to the ground in a hierarchical bit line architecture, it is necessary to activate all the selection gates of the selected sector to connect each bit line to a main bit line and then to draw the charge from the main bit line side (in a non-VGA hierarchical bit line non-volatile memory, a discharge transistor may be provided for each sector, but in a VGA non-volatile memory, the provision of a large transistor having a large channel length for high withstand voltage in each sector is unpractical as it increases the total circuit area). Then, only the selection gate used for the read operation needs to remain activated.

In other words, in a read operation, there is needed a discharge period for discharging each bit line to the ground. Moreover, the power consumption is increased for the need to activate all selection signals of the selected sector, and it may be necessary to add a booster circuit depending on the level of the selection signal (with low-voltage devices, the selection gates, etc., are often driven by the booster power supply).

FIG. 10A shows a configuration of a semiconductor non-volatile memory according to a second conventional example disclosed in Patent Document 3 where a hierarchical bit line architecture is employed. The operation of reading the memory cell 03 will now be described. A difference from the configuration of FIG. 9A is that when reading the memory cell 03, the bit line BL25 on the right side of the source bit line BL24 is connected to a neighbor effect canceller section NEC, which includes a current source 74 and a neighbor bit line reset transistor 73. The current source 74 supplies a current that is adjusted to about one half of the memory-cell-ON current.

The word line WL[00] is activated in order to read the memory cell 03. The selection gate signal SEL[06] is activated to connect the bit line BL23 (drain bit line) to the main bit line MBL[3] via the selection gate 42, and a Y selector 60c connects the main bit line MBL[3] to the voltage source Vd. The selection gate signal SEL[01] is activated to connect the bit line BL24 (source bit line) to the main bit line MBL[0] via the selection gate 31, and the Y selector 60c connects the main bit line MBL[0] to the sense amplifier 71 and the sense input reset transistor 70. Moreover, a selection gate signal SEL[05] is activated to connect the bit line BL25 (neighbor bit line) to a main bit line MBL[1] via a selection gate 41, and the Y selector 60c connects the main bit line MBL[1] to the current source 74 and the neighbor bit line reset transistor 73.

The sense input reset transistor 70 and the neighbor bit line reset transistor 73 are left ON until the voltage applied to the memory cell 03 becomes stable, after which the sense input reset transistor 70 and the neighbor bit line reset transistor 73 are opened. Where the memory cell 03 is in the "1" state (or "ON"), the voltage Vs of the source bit line BL24 is gradually increased by the current flow between the bit lines BL23 and BL24. Where the memory cell 03 is in the "0" state (or "OFF"), no current flows between the bit lines BL23 and BL24, and the voltage Vs of the source bit line BL24 remains at 0 V. The voltage of the neighbor bit line BL25 increases, as does the source bit line BL24, by the current flow from the current source 74. FIG. 10B shows the potential of each bit line after the passage of the sense integration period.

In the first conventional example, when the memory cell 04 is "1", a part of the memory cell current flowing out of the memory cell 03 flows out to the bit line BL25 via the memory cell 04, whereby the memory cell current cannot entirely be reflected to the read voltage. In contrast, in the second conventional example, as the voltage of the bit line BL25 increases, the current flowing out of the memory cell 03 is compensated for (neighbor effect being canceled), whereby the memory cell current can effectively be transmitted to the sense amplifier input as a voltage change.

Thus, the second conventional example enables a sensing operation with a higher sensitivity. However, if an unnecessary charge remains on a bit line further to the right of the neighbor bit line BL25, an unintended current flows into the neighbor bit line BL25 during a read operation. Then, there will be excessive neighbor effect canceling, whereby the memory cell 03 being "0" may be erroneously interpreted as "1".

Therefore, also in the second conventional example, in order to discharge all of the bit lines to the ground, it is necessary as in the first conventional example to activate all the selection gates of the selected sector to connect each bit line to a main bit line and then to draw the charge from the main bit line side. Then, only the selection gate used for the read operation needs to remain activated.

In other words, in a read operation, there is needed a discharge period for discharging each bit line to the ground. Moreover, the power consumption is increased for the need to activate all selection signals of the selected sector, and it may be necessary to add a booster circuit depending on the level of the selection signal.

As described above, it is necessary in the prior art to provide a period for discharging each bit line in the sector before a read operation, which inhibits the realization of faster systems. If the power consumption of the circuit increases due to the discharge operation, and if a booster power supply is used for the discharge operation, the chip area is increased by the area of the booster circuit.

It is an object of the present invention to provide a semiconductor non-volatile memory with which a memory cell can be read accurately without having to discharge bit lines before the read operation, thereby allowing for an increase in the operation speed and a reduction in the power consumption and the circuit area.

A semiconductor non-volatile memory of the present invention is a ground-sensing semiconductor non-volatile memory, including: a memory cell array at least including a first memory cell, a first bit line connected to a drain of the first memory cell, a second bit line connected to a source of the first memory cell, and a third bit line provided in the vicinity of a source of a second memory cell whose drain is connected to the second bit line; a sense amplifier; a voltage source for supplying a predetermined read voltage; a ground power supply; a selection circuit for selectively connecting the first to third bit lines to the sense amplifier, the voltage source and the ground power supply; and selection control means for controlling the selection circuit, wherein the selection control means controls the selection circuit so that the first bit line is connected to the voltage source, the second bit line to the sense amplifier, and the third bit line to the ground power supply during an operation of reading the first memory cell.

According to the present invention, when reading the first memory cell, a predetermined voltage is applied to the first bit line connected to the drain thereof, and the second bit line connected to the source thereof is connected to the sense amplifier. The third bit line provided in the vicinity of the source of the second memory cell whose drain is connected to the second bit line is connected to the ground power supply. Thus, since the third bit line in the vicinity of the second bit line being sensed is forcibly set to the ground level, no charge flows in therefrom, thus preventing a current from flowing into the second bit line. Therefore, it is possible to accurately read the first memory cell without having to discharge bit lines before the read operation. Therefore, it is no longer necessary to provide a discharge period for discharging each bit line in the sector, whereby it is possible to increase the access speed and to eliminate the need for a circuit such as a booster power supply for the discharge operation, thus allowing for a reduction in the power consumption and the chip area.

Another semiconductor non-volatile memory of the present invention is a ground-sensing semiconductor non-volatile memory, including: a memory cell array at least including a first memory cell, a first bit line connected to a drain of the first memory cell, a second bit line connected to a source of the first memory cell, a third bit line connected to a source of a second memory cell whose drain is connected to the second bit line, and a fourth bit line provided in the vicinity of a source of a third memory cell whose drain is connected to the third bit line; a sense amplifier; a voltage source for supplying a predetermined read voltage; a ground power supply; a current source for supplying a current smaller than a memory-cell-ON current; a selection circuit for selectively connecting the first to fourth bit lines to the sense amplifier, the voltage source, the ground power supply and the current source; and selection control means for controlling the selection circuit, wherein the selection control means controls the selection circuit so that the first bit line is connected to the voltage source, the second bit line to the sense amplifier, the third bit line to the current source, and the fourth bit line to the ground power supply during an operation of reading the first memory cell.

According to the present invention, when reading the first memory cell, a predetermined voltage is applied to the first bit line connected to the drain thereof, and the second bit line connected to the source thereof is connected to the sense amplifier. The third bit line connected to the source of the second memory cell whose drain is connected to the second bit line is connected to the current source supplying a current smaller than the memory-cell-ON current. Thus, the voltage of the third bit line increases as does the voltage of the second bit line, whereby it is possible to prevent the memory-cell-ON current from leaking out to the third bit line. The fourth bit line provided in the vicinity of the source of the third memory cell whose drain is connected to the third bit line is connected to the ground power supply. Thus, since the fourth bit line in the vicinity of the third bit line is set to the ground level, no charge flows in therefrom, thus preventing a current flowing into the second bit line from the third bit line. Therefore, it is possible to accurately read the first memory cell without having to discharge bit lines before the read operation. Therefore, it is no longer necessary to provide a discharge period for discharging each bit line in the sector, whereby it is possible to increase the access speed and to eliminate the need for a circuit such as a booster power supply for the discharge operation, thus allowing for a reduction in the power consumption and the chip area.

As described above, the present invention provides a semiconductor non-volatile memory of a VGA-type, or the like, being an array configuration suitable for large-capacity applications, wherein it is no longer necessary to provide a discharge period for discharging each bit line in the sector before the read operation, whereby it is possible to shorten the cycle time, increase the access speed and to reduce the power consumption and the chip area.

BRIEF DESCRIPTION OF THE DRAWINGS

FIG. 2 shows an operation control according to the first embodiment of the present invention.

FIG. 3 shows potentials of bit lines in the vicinity of a memory cell being read according to the first embodiment of the present invention.

FIG. 5 shows an operation control according to the second embodiment of the present invention.

FIG. 6 shows potentials of bit lines in the vicinity of a memory cell being read according to the second embodiment of the present invention.

DETAILED DESCRIPTION OF THE INVENTION

Embodiments of the present invention will now be described with reference to the drawings.

First Embodiment

Figure 1:
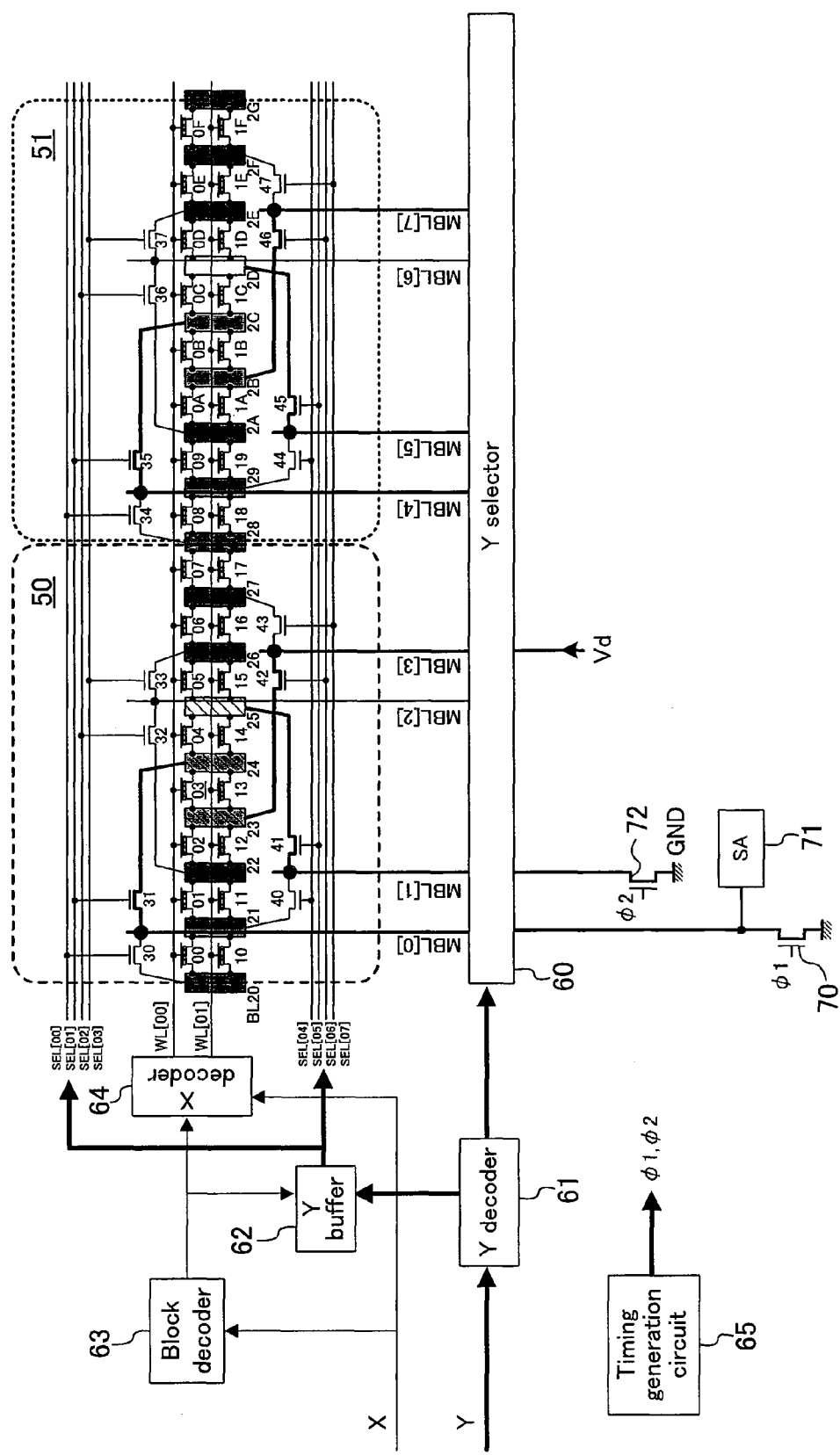
FIG. 1 shows a configuration of a semiconductor non-volatile memory according to a first embodiment of the present invention.

FIG. 1 shows a configuration of a semiconductor non-volatile memory according to a first embodiment of the present invention. The semiconductor non-volatile memory of FIG. 1 is a VGA (Virtual Ground Architecture)-type semiconductor non-volatile memory, including an uninterrupted arrangement of memory cells between bit lines, wherein adjacent memory cells share a bit line therebetween. Reference numerals 00 to 0F and 10 to 1F denote memory cells, reference numerals BL20 to BL2G denote bit lines, which together form a memory cell array. For example, the bit line BL24 is connected to both the source of the memory cell 03 and the drain of the memory cell 04.

In FIG. 1, reference numerals WL[00] to WL[01] denote word lines, reference numerals MBL[0] to MBL[7] denote main bit lines, and reference numerals 30 to 37 and 40 to 47 denote selection gates selectively connecting the bit line BL20 to BL2G to the main bit lines MBL[0] to MBL[7] based on the selection gate signals SEL[00] to SEL[07]. Reference numeral 63 denotes a block decoder for receiving an X address to activate a sector, reference numeral 64 denotes an X decoder for receiving an X address to activate the word lines WL[00] to WL[01], reference numeral 60 denotes a Y selector for selectively selecting the main bit lines MBL[0] to MBL[7] to circuit elements used during a sensing operation, reference numeral 61 denotes a Y decoder for receiving a Y address to output the selection gate signals SEL[00] to SEL[07] and a selection signal to be given to the Y selector 60, and reference numeral 62 denotes a Y buffer for receiving an activation signal of the block decoder 63 to activate and output the selection gate signals SEL[00] to SEL[07].

As circuit elements used during a sensing operation, the semiconductor non-volatile memory of FIG. 1 further includes the sense amplifier 71, the sense input reset transistor 70, the voltage source Vd for applying a predetermined read voltage to memory cells, the ground power supply GND, and a ground transistor 72 for bringing bit lines down to the GND level in a sensing operation. A timing generation circuit 65 outputs control signals f 1 and f 2 for the sense input reset transistor 70 and the ground transistor 72.

In view of the periodic arrangement of selection gates, the regions 50 and 51 are shown in the figure as unit regions, for the sake of understanding.

The Y selector 60, the main bit lines MBL[0] to MBL[7] and the selection gates 30 to 37 and 40 to 47 together form a selection circuit. Moreover, the Y decoder 61 and the Y buffer 62 together form selection control means.

The operation of the semiconductor non-volatile memory of FIG. 1 will now be described. In the illustrated example, the memory cell 03 as the first memory cell is read. In this example, the bit line BL23 (the first bit line connected to the drain of the memory cell 03) is assigned as the drain bit line, the bit line BL24 (the second bit line connected to the source of the memory cell 03) as the source bit line, and the bit line BL25 (the third bit line connected to the source of the memory cell 04 as the second memory cell whose drain is connected to the bit line BL24) as the ground bit line.

FIG. 2 shows the state of the main bit lines MBL[0] to MBL[7] and that of the selection gate signals SEL[00] to SEL[07] when reading the memory cells 00 to 07. The operation to be described below is according to the column of "READ03".

When reading the memory cell 03, first, the X address is supplied to activate the output of the block decoder 63 and activate an X decoder 64 and the Y buffer 62. According to the X address, the word line WL[00] being the output of the X decoder 64 is activated. Thus, the memory cells 00 to 0F are activated. Similarly, the Y address is supplied to activate the outputs of the Y decoder 61, and one of the outputs is given to the Y buffer 62, which has been activated by the X address. Thus, the selection gate signals SEL[01], SEL[05] and SEL[06] output from the Y buffer 62 are activated (see "READ03" in FIG. 2). The other output of the Y decoder 61 is given to the Y selector 60, and the Y selector 60 connects the main bit line MBL[0] to the sense amplifier 71 and the sense input reset transistor 70, connects the main bit line MBL[1] to the ground power supply GND via the ground transistor 72, and connects the main bit line MBL[3] to the voltage source Vd.

With such a selection control, the drain bit line BL23 is connected to the voltage source Vd via the main bit line MBL[3], the source bit line BL24 to the sense amplifier 71 via the main bit line MBL[0], and the ground bit line BL25 to the ground power supply GND via the main bit line MBL[1].

The control signal f 1 of the sense input reset transistor 70 is kept high, and the node connected to the sense amplifier 71 is kept in the reset state. The control signal f 2 of the ground transistor 72 is kept high. Depending on the circuit configuration, the ground transistor 72 may be omitted, and the signal line from the Y selector 60 may be grounded directly. The voltage source Vd may be activated before being connected to the drain bit line by the Y selector 60, or may be connected to the Y selector 60 via an additional selector.

After the passage of a predetermined period of time, the timing generation circuit 65 brings the control signal f 1 of the sense input reset transistor 70 to low. The predetermined period of time is set to an amount of time that is required for the voltages of the drain bit line BL23, the source bit line BL24 and the ground bit line BL25 become stable. The sense integration period starts at the point in time when the control signal f 1 goes low. At this point, the voltage Vd is supplied to the drain bit line BL23, and the voltage of the source bit line BL24 is 0 V as a result of the reset operation of the sense input reset transistor 70. The ground bit line BL25 is at the ground potential.

As the sense integration period is started, the potential of the source bit line BL24 changes over time differently depending on the state ("1" or "0") of the memory cell 03 (i.e., the presence/absence of a current flow from the drain side). When the memory cell 03 is in the "1" state, there is a flow of the memory-cell-ON current, the floating capacitor of the node connected to the source bit line BL24 is charged, thereby increasing the potential of the source bit line BL24. When the memory cell 03 is in the "0" state, there is no flow of the memory cell current, and the potential of the source bit line BL24 does not increase.

FIG. 3 shows potentials of bit lines in the vicinity of the memory cell 03 being read, upon completion of the sense integration period. As shown in FIG. 3, upon completion of the sense integration period, the voltage Vs of the source bit line BL24 takes one of different values depending on the state ("1" or "0") of the memory cell 03. The sense amplifier 71 outputs "1" or "0" according to the value of the voltage Vs. Although not shown in the figure, the sensing operation is typically performed with reference memory cells similar to the regular memory cells and current paths similar to those of the regular memory cells being provided on the reference side. A reference memory cell is designed so that the ON current thereof is adjusted to about one half of the ON current of a regular memory cell current, and the bit line potential thereof takes a value ("REF" in FIG. 3) in the middle between two values of the voltage Vs corresponding respectively to "1" and "0", upon completion of the sense integration period. Then, "1" or "0" is read out based on the difference between the source bit line voltage of the memory cell being read and that of the reference memory cell.

An example will now be described with specific figures. Where the voltage Vd is about 1.5 V, the drain bit line BL23 is under a voltage of about 1.5 V. It is assumed herein that the sense integration period is set so that where the memory cell 03 being read is in the "1" state, the voltage of the source bit line BL24 increases, and the sensing operation is performed when a voltage of about 0.15 V appears. When the memory cell 03 being read is in the "0" state, the voltage remains at 0 V. Strictly speaking, where the memory cell 03 being read is "1", what is observed will vary depending on whether the adjacent memory cell 04 is "1" or "0". When the memory cell 04 is "1", the memory-cell-ON current of the memory cell 03 being read does not entirely contribute to the charging of the source bit line BL24, but a part of the memory-cell-ON current leaks out to the adjacent ground bit line BL25. Note however that the drain-source voltage of the memory cell 03 being read and that of the adjacent memory cell 04 are 1.35 (1.5-0.15) V and 0.15 V, respectively, representing an about 10-fold difference. Therefore, the current leaking out to the ground bit line BL25 is about one tenth of the memory-cell-ON current, which is negligible. Thus, most of the memory-cell-ON current contributes to the charging of the source bit line BL24.

The effect of connecting the bit line BL25 to the ground power supply GND will now be described. Where the bit line BL25 is not connected to the ground power supply GND, there may remain a charge on the bit line BL25 when reading the memory cell 03. This is where, for example, a memory cell on the source side of the memory cell 03 is read previously and the bit line BL25 is charged up to the voltage Vd. Where a charge is remaining on the bit line BL25, a current may possibly flow from the bit line BL25 to the source bit line BL24 during the sense integration period in the operation of reading the memory cell 03. In such a case, the potential of the source bit line BL24 may increase due to the flow of the charge from the bit line BL25, even though the memory cell 03 is "0", whereby "1" may be read out erroneously.

In contrast, in the present embodiment, the bit line BL25 is connected to the ground power supply GND, the bit line BL25 adjacent to the source bit line BL24 is forcibly set to the ground level when reading the memory cell 03. Therefore, no charge flows in from the bit line BL25, and it is possible to prevent a current from flowing into the source bit line BL24. Thus, the memory cell 03 can be read accurately without having to discharge bit lines before the read operation. Therefore, it is no longer necessary to provide a discharge period for discharging each bit line in the sector, whereby it is possible to increase the access speed and to eliminate the need for a circuit such as a booster power supply for the discharge operation, thus allowing for a reduction in the power consumption and the chip area.

In the present embodiment, the ground bit line connected to the ground power supply is assumed to be a bit line adjacent to the source bit line. Similar effects to those of the present embodiment can be obtained when a bit line adjacent to the source of a memory cell whose drain is connected to the source bit line is connected to the ground power supply. For example, there may be a case where a bit line adjacent to the source bit line cannot be used as the ground bit line due to problems with the layout of selection gates and main bit lines, for example. In such a case, there may be a plurality of other bit lines between the source bit line and the ground bit line. Similar effects can be expected if the number of bit lines between the source bit line and the ground bit line is so small that the bit lines can be discharged through memory cells connected to the active word line while waiting for the voltage of the drain bit line and that of the source bit line to become stable.

As described above, according to the present embodiment, the source bit line serving as the sense node is sandwiched between the drain bit line to which a read voltage is applied and the ground bit line which is grounded during the sense integration period as shown in FIG. 3. Therefore, even if there is an excessive charge on multiple bit lines before the read operation, the ground bit line has the shielding effect, thereby always ensuring a sensing operation under constant conditions. Thus, contrary to the prior art, it is no longer necessary to discharge all of the bit lines, and it is possible to perform a stable sensing operation.

Second Embodiment

Figure 4:
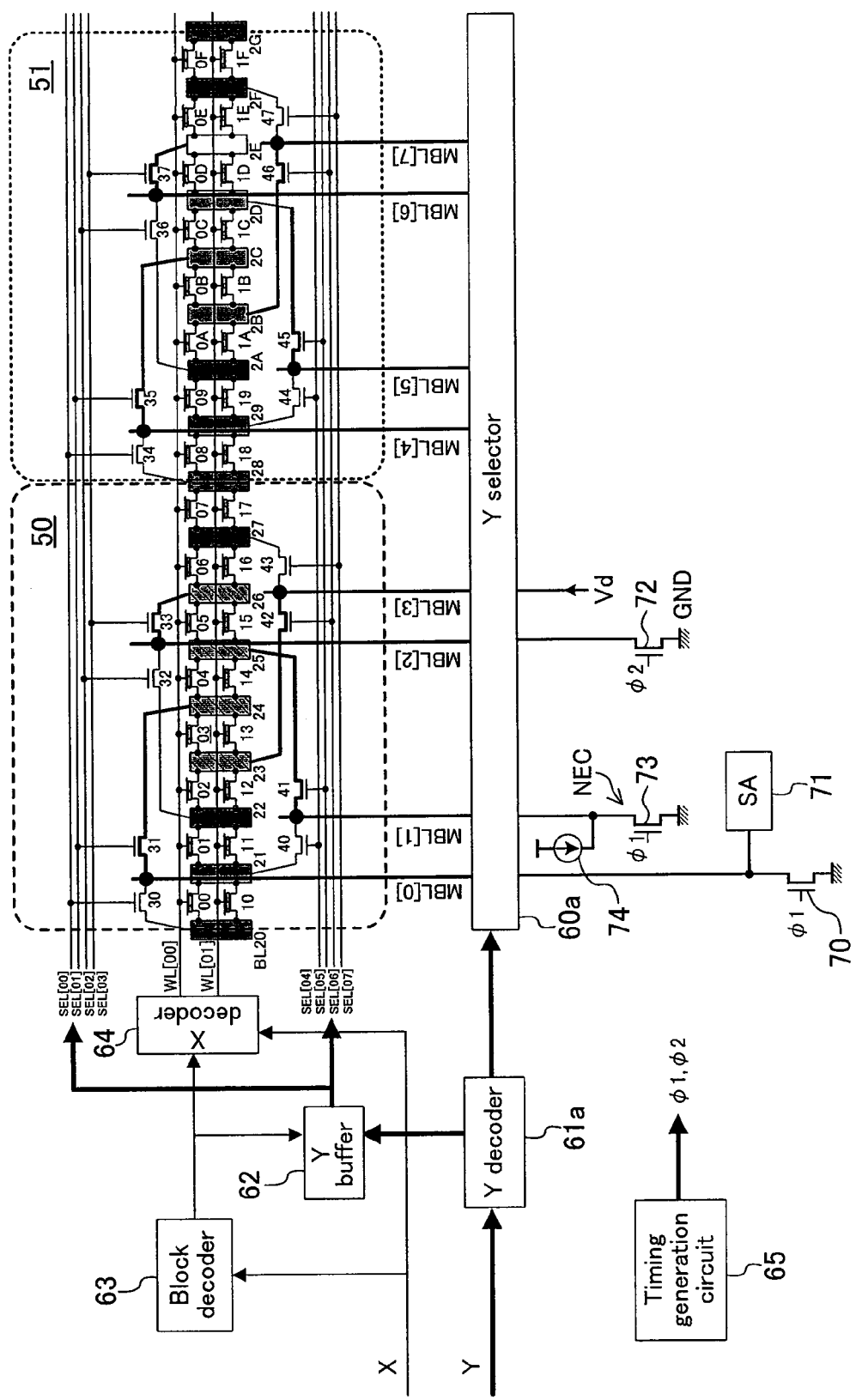
FIG. 4 shows a configuration of a semiconductor non-volatile memory according to a second embodiment of the present invention.

FIG. 4 shows a configuration of a semiconductor non-volatile memory according to a second embodiment of the present invention. In FIG. 4, like elements to those of FIG. 1 are denoted by like reference numerals and will not be further described below.

In addition to the configuration of FIG. 1, the semiconductor non-volatile memory of FIG. 4 includes the neighbor effect canceller section NEC as a circuit element used during a sensing operation. The neighbor effect canceller section NEC includes the neighbor bit line reset transistor 73, and the current source 74 for supplying a smaller current than the memory-cell-ON current. The current of the current source 74 is adjusted to about the same as the reference current, i.e., about one half of the current when the memory cell is "1". The neighbor bit line reset transistor 73 receives the same control signal f1 as that of the sense input reset transistor 70. A Y selector 60a is configured so that the main bit lines MBL[0] to MBL[7] can be selectively connected to the neighbor effect canceller section NEC, as well as to the sense amplifier 71, the voltage source Vd and the ground power supply GND, and a Y decoder 61a outputs a selection signal therefor to the Y selector 60a.

The Y selector 60, the main bit lines MBL[0] to MBL[7] and the selection gates 30 to 37 and 40 to 47 together form a selection circuit. Moreover, the Y decoder 61a and the Y buffer 62 together form selection control means.

The operation of the semiconductor non-volatile memory of FIG. 4 will now be described. As in the first embodiment, the memory cell 03 as the first memory cell is read in the illustrated example. In this example, the bit line BL23 (the first bit line connected to the drain of the memory cell 03) is assigned as the drain bit line, the bit line BL24 (the second bit line connected to the source of the memory cell 03) as the source bit line, the bit line BL25 (the third bit line connected to the source of the memory cell 04 as the second memory cell whose drain is connected to the bit line BL24) as the neighbor bit line, and the bit line BL26 (the fourth bit line connected to the source of the memory cell 05 as the third memory cell whose drain is connected to the bit line BL25) as the ground bit line.

FIG. 5 shows the state of the main bit lines MBL[0] to MBL[7] and that of the selection gate signals SEL[00] to SEL[07] when reading the memory cells 00 to 07. The operation to be described below is according to the column of "READ03".

When reading the memory cell 03, first, the X address is supplied to activate the output of the block decoder 63 and activate the X decoder 64 and the Y buffer 62. According to the X address, the word line WL[00] being the output of the X decoder 64 is activated. Thus, the memory cells 00 to 0F are activated. Similarly, the Y address is supplied to activate the outputs of the Y decoder 61a, and one of the outputs is given to the Y buffer 62, which has been activated by the X address. Thus, the selection gate signals SEL[01], SEL[02], SEL[05] and SEL[06] output from the Y buffer 62 are activated (see "READ03" in FIG. 5). The other output of the Y decoder 61a is given to the Y selector 60a, and the Y selector 60a connects the main bit line MBL[0] to the sense amplifier 71 and the sense input reset transistor 70, connects the main bit line MBL[1] to the neighbor effect canceller section NEC, connects the main bit line MBL[2] to the ground power supply GND via the ground transistor 72, and connects the main bit line MBL[3] to the voltage source Vd.

With such a selection control, the drain bit line BL23 is connected to the voltage source Vd via the main bit line MBL[3], the source bit line BL24 to the sense amplifier 71 via the main bit line MBL[0], the neighbor bit line BL25 to the current source 74 via the main bit line MBL[1], and the ground bit line BL26 to the ground power supply GND via the main bit line MBL[2].

The control signal f1 of the sense input reset transistor 70 and that of the neighbor bit line reset transistor 73 are kept high, and the node connected to the sense amplifier 71 and the node connected to the current source 74 are kept in the reset state. The control signal f2 of the ground transistor 72 is kept high.

After the passage of a predetermined period of time, the timing generation circuit 65 brings the control signal f1 of the sense input reset transistor 70 and that of the neighbor bit line reset transistor 73 to low. The predetermined period of time is set to an amount of time that is required for the voltages of the drain bit line BL23, the source bit line BL24, the neighbor bit line BL25 and the ground bit line BL26 become stable. The sense integration period starts at the point in time when the control signal f 1 goes low. At this point, the voltage Vd is supplied to the drain bit line BL23, the voltage of the source bit line BL24 is 0 V as a result of the reset operation of the sense input reset transistor 70, and the voltage of the neighbor bit line BL25 is 0 V as a result of the reset operation of the neighbor bit line reset transistor 73. The ground bit line BL25 is at the ground potential.

As the sense integration period is started, the potential of the source bit line BL24 changes over time differently depending on the state ("1" or "0") of the memory cell 03 (i.e., the presence/absence of a current flow from the drain side). When the memory cell 03 is in the "1" state, there is a flow of the memory-cell-ON current, the floating capacitor of the node connected to the source bit line BL24 is charged, thereby increasing the potential of the source bit line BL24. When the memory cell 03 is in the "0" state, there is no flow of the memory cell current, and the potential of the source bit line BL24 does not increase.

The neighbor bit line BL25 is also charged by the constant current source 74, thus increasing the potential thereof. Note however that since the current of the constant current source 74 is smaller than the memory-cell-ON current, the potential of the neighbor bit line BL25 increases more slowly than the potential of the source bit line BL24 when the memory cell 03 is in the "1" state.

FIG. 6 shows potentials of bit lines in the vicinity of the memory cell 03 being read, upon completion of the sense integration period. As shown in FIG. 6, upon completion of the sense integration period, the voltage Vs of the source bit line BL24 takes one of different values depending on the state ("1" or "0") of the memory cell 03. The sense amplifier 71 outputs "1" or "0" according to the value of the voltage Vs. The neighbor bit line BL25 also has a potential Vns caused by the constant current source 74.

In the first embodiment, where the memory cell 03 being read is "1" and if the adjacent memory cell 04 is "1", a part (about one tenth) of the memory-cell-ON current of the memory cell 03 being read leaks out to the adjacent bit line BL25. In contrast, in the present embodiment, the potential of the neighbor bit line BL25 increases to thereby reduce the potential difference between the source bit line BL24 and the neighbor bit line BL25, thus reducing the neighbor effect, by which a part of the memory-cell-ON current of the memory cell 03 being read leaks out.

Moreover, in the present embodiment, the bit line BL26 adjacent to the neighbor bit line BL25 is connected to the ground power supply GND to thereby forcibly set the bit line to the ground level. Where the bit line BL26 is not connected to the ground power supply GND, if there is a charge remaining on the bit line BL26 or an adjacent bit line, a current may possibly flow into the neighbor bit line BL25 from the bit line BL26, or the like, during the sense integration period in the operation of reading the memory cell 03. Then, more current than expected may flow into the neighbor bit line BL25, whereby a current flows also into the source bit line BL24. Thus, in the present embodiment, the bit line BL26 adjacent to the neighbor bit line BL25 is used as the ground bit line, whereby it is possible to suppress the floating of the source bit line BL24 due to an excessive charge.

As described above, also in the present embodiment, it is possible to normally perform the sensing operation without having to provide a discharge period for discharging bit lines to the ground level, thus realizing a high-speed, high-precision semiconductor non-volatile memory.

While a bit line adjacent to the neighbor bit line is used as the ground bit line to be connected to the ground power supply in the present embodiment, similar effects to those of the present embodiment can be obtained by connecting, to the ground power supply, a bit line provided in the vicinity of the source of the memory cell whose drain is connected to the neighbor bit line.

Third Embodiment

The configuration of a semiconductor non-volatile memory according to a third embodiment of the present invention is similar to that shown in FIG. 1. In the present embodiment, when reading a memory cell, a bit line that is adjacent to the drain bit line and on the opposite side of the drain bit line to the source bit line is also forcibly set to the ground potential. For example, when reading the memory cell 03, a bit line BL22 that is connected to the drain of the memory cell 02 as the third memory cell whose source is connected to the drain bit line BL23 is also connected to the ground power supply GND. Otherwise, the operation is similar to that of the first embodiment.

Figure 7:
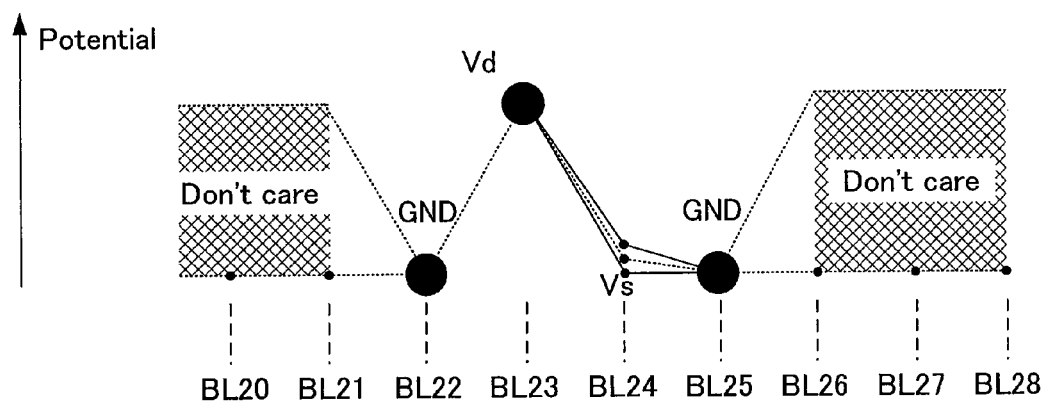
FIG. 7 shows potentials of bit lines in the vicinity of a memory cell being read according to a third embodiment of the present invention.

FIG. 7 shows potentials of bit lines in the vicinity of the memory cell 03 being read of the present embodiment, upon completion of the sense integration period. As shown in FIG. 7, the bit line BL22 adjacent to the drain bit line BL23 and on the opposite side of the drain bit line BL23 to the source bit line BL24 is at the ground potential.

Where the bit line BL22 is not set to the ground potential and where the next memory cell to the left along the active word line also stores "1", if the same address is repeatedly read, the bit line on the left side of the drain bit line BL23 is successively charged up to the voltage Vd. While a bit line to which a main bit line is directly connected can be discharged in a short period of time, a bit line to which a main bit line is not directly connected can only be discharged via a memory cell. Therefore, an excessive charge is likely to remain upon completion of the predetermined discharge time. In a rewritable non-volatile memory, or the like, the state where a voltage is applied to the drain and the word line is at 0 V may possibly continue, thus resulting in a drain disturb, which may inhibit the memory from holding the stored value.

In contrast, if a bit line adjacent to the drain bit line and on the opposite side of the drain bit line to the source bit line is fixed to the ground potential, as in the present embodiment, the opposite ends of the bit line involved in the sensing operation will be at the ground potential, thereby preventing charge from leaking out to opposite sides of the memory cell being read. Thus, the memory of the present invention is free of the charge-up of the memory plane, which may occur when the same position is read repeatedly, whereby the memory will not be inhibited by drain disturb, or the like, from holding the stored value.

Fourth Embodiment

The configuration of a semiconductor non-volatile memory according to a fourth embodiment of the present invention is similar to that shown in FIG. 4. In the present embodiment, when reading a memory cell, a bit line that is adjacent to the drain bit line and on the opposite side of the drain bit line to the source bit line is also forcibly set to the ground potential, as in the third embodiment. For example, when reading the memory cell 03, the bit line BL22 that is connected to the drain of the memory cell 02 as the fourth memory cell whose source is connected to the drain bit line BL23 is also connected to the ground power supply GND. Otherwise, the operation is similar to that of the second embodiment.

Figure 8:
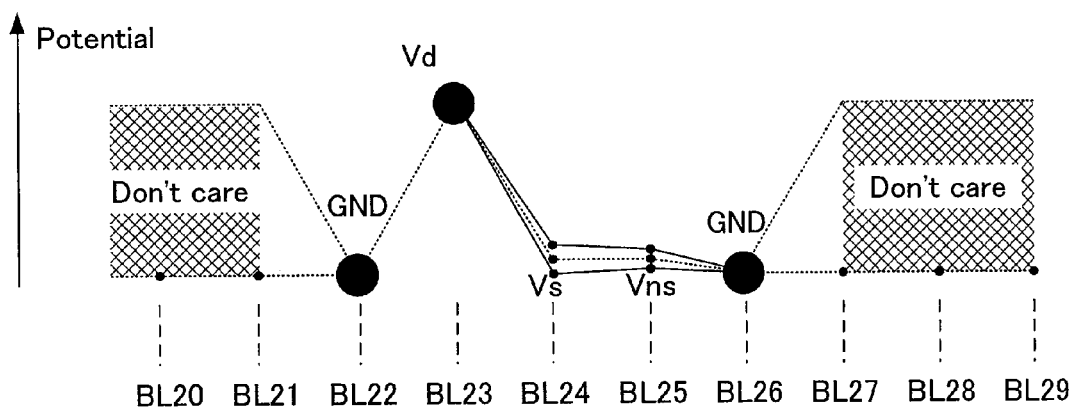
FIG. 8 shows potentials of bit lines in the vicinity of a memory cell being read according to a fourth embodiment of the present invention.
Figure 9A:
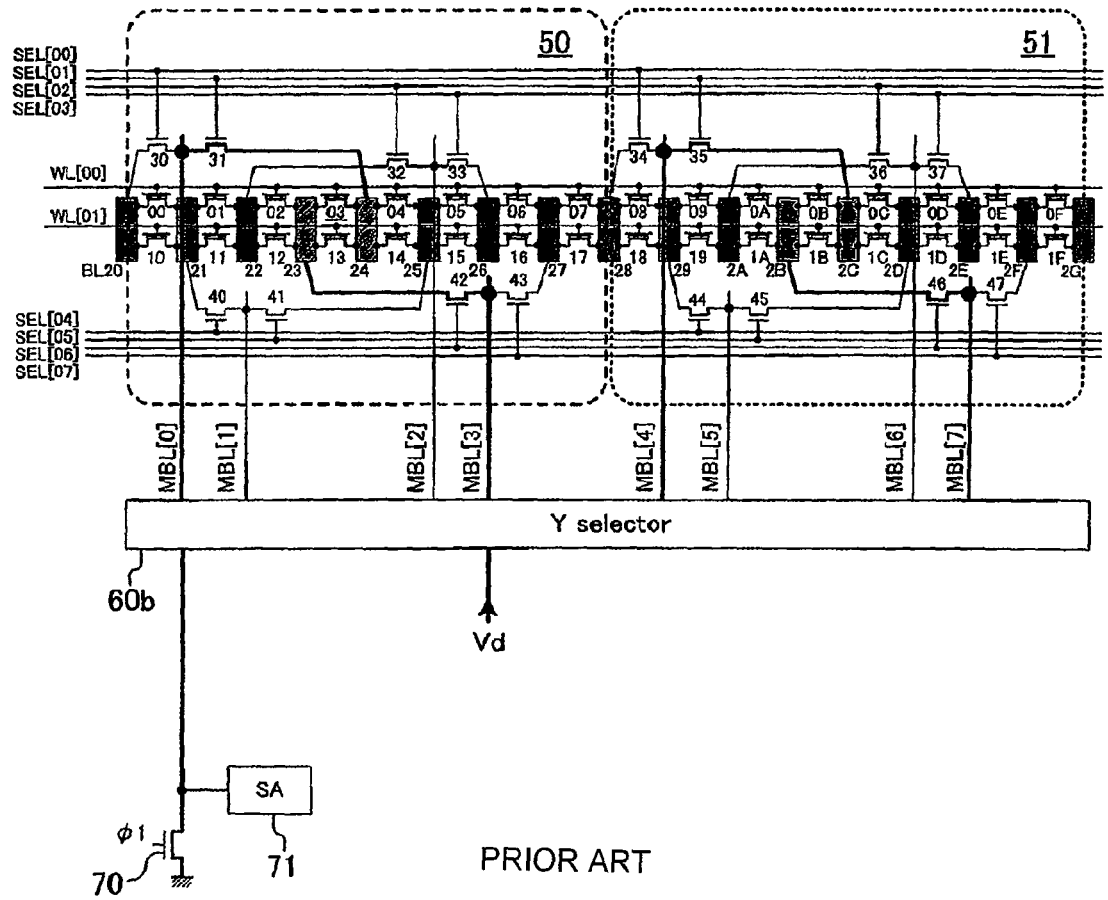
FIG. 9A shows a configuration of a semiconductor non-volatile memory of a first conventional example where a hierarchical bit line architecture is employed.
Figure 9B:
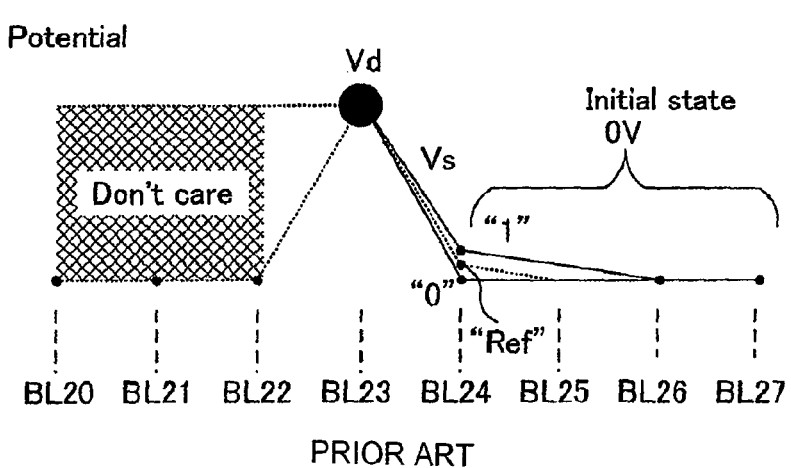
FIG. 9B shows potentials of bit lines in the vicinity of a memory cell being read in the configuration shown in FIG. 9A.
Figure 10A:
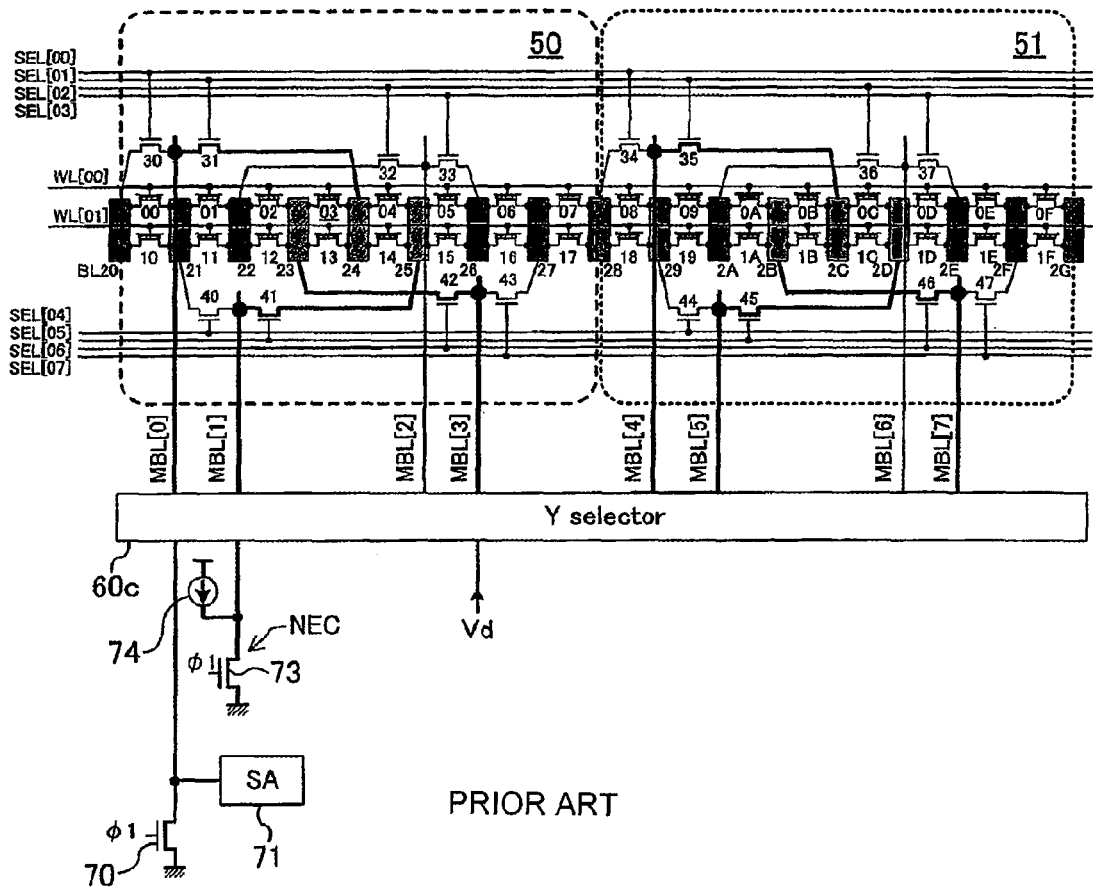
FIG. 10A shows a configuration of a semiconductor non-volatile memory of a second conventional example where a hierarchical bit line architecture is employed.
Figure 10B:
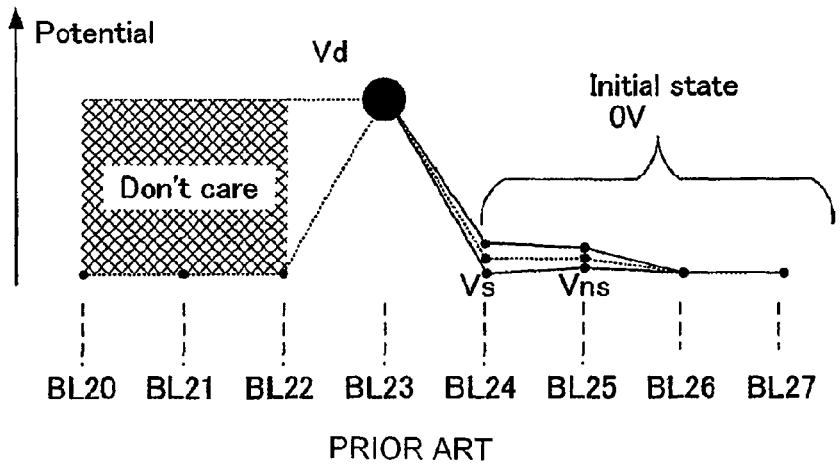
FIG. 10B shows potentials of bit lines in the vicinity of a memory cell being read in the configuration shown in FIG. 10A.

FIG. 8 shows potentials of bit lines in the vicinity of the memory cell 03 being read of the present embodiment, upon completion of the sense integration period. As shown in FIG. 8, the bit line BL22 adjacent to the drain bit line BL23 and on the opposite side of the drain bit line BL23 to the source bit line BL24 is at the ground potential.

Thus, as in the third embodiment, the memory of the present embodiment is also free of the charge-up of the memory plane, which may occur when the same position is read repeatedly, whereby the memory will not be inhibited by drain disturb, or the like, from holding the stored value.

While a bit line adjacent to the drain bit line is used as the bit line to be connected to the ground power supply in the third and fourth embodiments, similar effects to those of the third and fourth embodiments can be obtained by connecting, to the ground power supply, a bit line provided in the vicinity of the drain of the memory cell whose source is connected to the drain bit line.

While the embodiments above are each directed to a VGA-type non-volatile memory cell, the non-volatile memory cell may be any other suitable type, including a floating gate type, a space charge accumulation type such as SONOS, etc. While the description above is directed to a 1-bit/cell non-volatile memory cell, the present invention is also applicable to a multi-level memory cell based on threshold voltages, or a multi-level memory cell, such as an NROM, where information is physically written both on the drain and on the source of each cell.

While the embodiments described above assume a hierarchical bit line architecture, it is understood that the present invention is also effective with non-hierarchical bit line architectures.

The present invention, which realizes a faster sensing operation in a semiconductor non-volatile memory of a VGA-type, or the like, being an array configuration suitable for large-capacity applications, is useful in realizing a shorter memory cycle time and a faster memory access, for example.

What is claimed is:

1. A ground-sensing semiconductor non-volatile memory, comprising:
   a memory cell array at least including a first memory cell, a first bit line connected to a drain of the first memory cell, a second bit line connected to a source of the first memory cell, and a third bit line provided in the vicinity of a source of a second memory cell whose drain is connected to the second bit line;
   a sense amplifier;
   a voltage source for supplying a predetermined read voltage;
   a ground power supply;
   a selection circuit for selectively connecting the first to third bit lines to the sense amplifier, the voltage source and the ground power supply; and
   selection control means for controlling the selection circuit,
   wherein the selection control means controls the selection circuit so that the first bit line is connected to the voltage source, the second bit line to the sense amplifier, and the third bit line to the ground power supply during an operation of reading the first memory cell.

2. The ground-sensing semiconductor non-volatile memory of claim 1, wherein the third bit line is a bit line connected to the source of the second memory cell.

3. The ground-sensing semiconductor non-volatile memory of claim 1, wherein:
   the memory cell array includes a fourth bit line provided in the vicinity of a drain of a third memory cell whose source is connected to the first bit line; and
   the selection control means controls the selection circuit so that the fourth bit line is connected to the ground power supply during an operation of reading the first memory cell.

4. The ground-sensing semiconductor non-volatile memory of claim 3, wherein the fourth bit line is a bit line connected to the drain of the third memory cell.

5. A ground-sensing semiconductor non-volatile memory, comprising:
   a memory cell array at least including a first memory cell, a first bit line connected to a drain of the first memory cell, a second bit line connected to a source of the first memory cell, a third bit line connected to a source of a second memory cell whose drain is connected to the second bit line, and a fourth bit line provided in the vicinity of a source of a third memory cell whose drain is connected to the third bit line;
   a sense amplifier;
   a voltage source for supplying a predetermined read voltage;
   a ground power supply;
   a current source for supplying a current smaller than a memory-cell-ON current;
   a selection circuit for selectively connecting the first to fourth bit lines to the sense amplifier, the voltage source, the ground power supply and the current source; and
   selection control means for controlling the selection circuit,
   wherein the selection control means controls the selection circuit so that the first bit line is connected to the voltage source, the second bit line to the sense amplifier, the third bit line to the current source, and the fourth bit line to the ground power supply during an operation of reading the first memory cell.

6. The ground-sensing semiconductor non-volatile memory of claim 5, wherein the fourth bit line is a bit line connected to the source of the third memory cell.

7. The ground-sensing semiconductor non-volatile memory of claim 5, wherein:
   the memory cell array includes a fifth bit line provided in the vicinity of a drain of a fourth memory cell whose source is connected to the first bit line; and
   the selection control means controls the selection circuit so that the fifth bit line is connected to the ground power supply during an operation of reading the first memory cell.

8. The ground-sensing semiconductor non-volatile memory of claim 7, wherein the fifth bit line is a bit line connected to the drain of the fourth memory cell.

* * * * *